United States Patent [19]

Proskow

[11] 4,415,652

[45] Nov. 15, 1983

[54] AQUEOUS PROCESSABLE, POSITIVE-WORKING PHOTOPOLYMER COMPOSITIONS

[75] Inventor: Stephen Proskow, Wilmington, Del.

[73] Assignee: E. I. Du Pont de Nemours & Co., Wilmington, Del.

[21] Appl. No.: 400,660

[22] Filed: Jul. 27, 1982

Related U.S. Application Data

[63] Continuation-in-part of Ser. No. 335,051, Jan. 4, 1982, which is a continuation-in-part of Ser. No. 271,411, Mar. 30, 1981, abandoned.

[51] Int. Cl.³ .............................................. G03C 1/68
[52] U.S. Cl. .................................... 430/277; 430/287; 430/326; 430/913; 204/159.16
[58] Field of Search ............... 430/277, 287, 326, 913, 430/286; 204/159.16, 159.17, 159.18, 159.2

[56] References Cited

U.S. PATENT DOCUMENTS

| | | | |
|---|---|---|---|
| 2,589,151 | 3/1952 | Serniuk | 260/79.5 |
| 3,627,529 | 12/1971 | Frank et al. | 96/33 |
| 3,660,088 | 5/1972 | Lundsager | 96/36 |
| 3,767,398 | 10/1973 | Morgan | 96/36.2 |
| 3,809,633 | 5/1974 | Magnotta et al. | 204/159.14 |
| 3,857,822 | 12/1974 | Frass | 260/78.5 T |
| 3,905,820 | 9/1975 | Frass | 96/86 P |
| 3,936,530 | 2/1976 | Morgan | 427/43 |
| 4,130,469 | 12/1978 | McGinniss | 204/159.16 |
| 4,179,295 | 12/1979 | Takamizawa et al. | 428/447 |
| 4,179,531 | 12/1979 | Hein et al. | 430/286 |
| 4,234,676 | 11/1980 | Hein et al. | 430/286 |
| 4,248,960 | 2/1981 | Hein et al. | 430/286 |
| 4,266,004 | 5/1981 | Kern | 430/269 |

FOREIGN PATENT DOCUMENTS

| | | |
|---|---|---|
| 1179252 | 1/1970 | United Kingdom . |
| 1390711 | 4/1975 | United Kingdom . |

OTHER PUBLICATIONS

Serniuk et al., J. Am. Chem. Soc., 70, pp. 1804 to 1808 (1948).
Marvel et al., Ind. Eng. Chem., 45, pp. 2090 to 2093 (1953).
Merrill et al., Research Disclosure, 143, p. 24 (1976).

*Primary Examiner*—J. Travis Brown
*Attorney, Agent, or Firm*—James A. Costello

[57] ABSTRACT

Three-component aqueous processable, positive-working photopolymer compositions comprising (i) an unsaturated polymer comprising (a) about 20 to 1000 milliequivalents of reactive unsaturated carbon to carbon groups per 100 g of polyene and (b) about 10 to 50 mol percent of N-alkenylmaleimide units; (ii) a reactive mercapto acid and (iii) a radiation-sensitive, radical-generating initiator; substrates coated with such compositions; and a photoimaging process.

26 Claims, No Drawings

AQUEOUS PROCESSABLE, POSITIVE-WORKING PHOTOPOLYMER COMPOSITIONS

CROSS-REFERENCE TO RELATED APPLICATIONS

This is a continuation-in-part of copending patent application bearing U.S. Ser. No. 335,051 filed on Jan. 4, 1982 which is a continuation-in-part of U.S. Ser. No. 271,411 filed on Mar. 30, 1981, now abandoned.

BACKGROUND OF THE INVENTION

This invention relates to photosensitive compositions containing an unsaturated polymer, a mercapto acid and a radical initiating system; to elements made from said compositions; and to a process for photoimaging said elements.

Background publications include the following items:

U.S. Pat. No. 4,179,531 discloses a curable composition comprising a monoalkenyl aromatic-diene copolymer resin, a monomer containing a photo-cross-linkable C=C, a polythiol, and a photoinitiator;

U.S. Pat. No. 4,234,676 discloses a curable composition containing an unsaturated polymer, a monomer, a thiol, and a curing agent;

U.S. Pat. No. 4,248,960 discloses a relief-producing laminate, the under-lamina composition being preferably a photocurable polymer composition;

U.S. Pat. No. 4,266,004 discloses the photoimaging of selected organic sulfide-containing polymers in the presence of oxygen and a photosensitizer;

British Pat. No. 1,390,711 and U.S. Pat. No. 3,767,398 disclose a curable composition consisting of a polymer with recurring units of the monoallyl ester of a methyl vinyl ether/maleic anhydride interpolymer and a polythiol, with or without a photocuring rate accelerator;

U.S. Pat. No. 3,809,633 discloses a chain-extended polythioether-containing polymer composition having reactive unsaturated carbon-carbon functional groups and/or reactive thiol groups within the molecule;

U.S. Pat. No. 3,660,088 discloses a process for etching metal employing a photocurable composition consisting of a polyene, a polythiol, and a photocuring rate accelerator;

U.S. Pat. No. 3,936,530 discloses a curable coating composition which consists of a styrene-allyl alcohol copolymer-based polyene and a polythiol component;

U.S. Pat. No. 3,627,529 discloses a process for preparing a lithographic printing plate from a photocurable composition of an ethylenically unsaturated polyene, a polythiol, and a photocurable rate accelerator;

U.S. Pat. No. 4,179,295 discloses a photosensitive composition containing an organopolysiloxane with aliphatically unsaturated linkages in the molecule and a mercapto-containing organopolysiloxane, the organopolysiloxane cured by irradiation with ultraviolet light to effect cross-linking;

U.S. Pat. No. 4,130,469 discloses a curable coating composition which contains a polymer with pendant mercaptan groups and a bis-maleimide cross-linking agent;

British Pat. No. 1,179,252 discloses the use of butadiene polymers containing carboxyl groups in the preparation of thermoplastic elastomer compositions;

U.S. Pat. No. 2,589,151 discloses thioglycolic acid adducts of butadiene copolymers, prepared in solution using a free-radical initiator; adduct structures being further discussed by Serniuk et al. in *J. Am. Chem. Soc.,* 70, pages 1804 to 1808 (1948);

Marvel et al., *Ind. Eng. Chem.,* 45, pages 2090 to 2093 (1953), disclose the modification of polybutadiene by addition of thiols containing polar groups such as mercaptoacetic acid, to give polymers with improved oil resistance;

Merrill et al., *Research Disclosure,* 143, page 24 (1976), disclose the use of mercapto acid derivatives of unsaturated polymers as a component in liquid electrographic developers.

U.S. Pat. Nos. 3,857,822 and 3,905,820 disclose copolymers containing N-allylmaleimide units and light-sensitive copying compositions which contain said copolymers. The copolymers are prepared by reaction of a precursor anhydride-containing copolymer with allylamine.

SUMMARY OF THE INVENTION

This invention concerns a photosensitive composition comprising the following components:

(i) about 10 to 90 percent by total weight of components (i), (ii), and (iii), of a polyene having a number average molecular weight of about 1,000 to 25,000, said polyene containing (a) about 20 to 1000 milliequivalents of reactive unsaturated carbon to carbon groups per 100 g of polyene, and (b) about 10 to 50 mole percent of N-alkenylmaleimide units in which the alkenyl group contains about 3 to 18 carbon atoms;

(ii) about 5 to 50 percent by total weight of components (i), (ii), and (iii), of a reactive mercapto acid; and (iii) about 0.1 to 50 percent by total weight of components (i), (ii), and (iii) of a radiation-sensitive, radical-generating system, activatable by actinic radiation to initiate addition of the mercapto acid to the polyene.

This invention also concerns a photosensitive element which comprises a substrate coated with a layer of the photosensitive composition having a thickness in the range of about 0.1 μm to 7600 μm or more. The preferred photosensitive elements are used as photoresists and proofing systems. The substrate can be any natural or synthetic support, preferably one capable of existing in flexible or rigid film or sheet form.

This invention also concerns a method of photoimaging which comprises imagewise exposing a photosensitive element to actinic radiation containing wavelengths of 2000 to 5000 Å through an image-bearing transparency, and developing the image.

The term "reactive" unsaturated carbon to carbon groups means groups which react under actinic radiation, in the presence of a photosensitizer, with the thiol group of a mercapto acid to yield the thioether linkage,

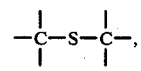

as contrasted with the "unreactive" groups,

found in aromatic nucleii such as cyclic structures exemplified by benzene, pyridine, naphthalene, and the like, which do not under the same conditions react with the thiol group to give thioether linkages.

The term "unsaturated carbon to carbon groups" means:

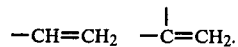

$$-CH=CH_2 \quad -\overset{|}{C}=CH_2.$$

The polyene can contain one type of such unsaturated group or it can contain two or more such types.

The polyene, component (i) of the photosensitive composition, has a preferred number average molecular weight of about 1,000 to 10,000 and a preferred degree of unsaturation of about 50 to 500 milliequivalents of reactive unsaturated carbon to carbon groups per 100 grams of polyene. Preferred quantities of polyene are about 40 to 80 percent of the total weight of components (i), (ii), and (iii).

It is preferred that substantially all of the reactive unsaturated carbon-to-carbon groups be contained in the N-alkenylmaleimide units. Preferably, these unsaturated groups are "terminal", i.e., at the end of the N-alkenyl chain.

Preferred polyenes contain at least one group selected from

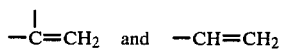

because of their high reactivity. Particularly preferred are N-alkenylmaleimide-containing polyenes derived from copolymers of styrene and maleic anhydride.

The preferred mercapto acids are mercaptocarboxylic acids. Preferably, the mercapto acid is present in an amount from about 10 to 40 percent by total weight of components (i), (ii), and (iii). The radical-generating system is preferably present at about 1 to 20 percent by total weight of components (i), (ii), and (iii). The preferred radical-generating system comprises benzoin ethers, especially benzil dimethyl ketal.

For high quality imaging applications, it has been found most beneficial to employ photosensitive elements that contain photosensitive layers having about 50% to 100% of the photosensitive composition described herein. The balance of the photosensitive layer, up to 50% by total weight of the layer, can be comprised of materials added to improve physical properties without contributing to photosensitivity.

The photosensitive compositions of this invention have utility in lithographic printing, gravure images, preparation of printing plates for offset and letter press, engineering drafting films, photoresists in making printed circuits or in chemical milling, solder masks, flexographic printing, microimages for information storage, and decoration of paper, glass, and metal packages. Other specific uses will be evident to those skilled in the art. Because the compositions are single-exposure, monomer-free, and positive-working using aqueous solvent washout development, they are particularly useful in positive-working photoresist applications.

Photosensitive compositions based on the preferred N-alkenylmaleimide-containing polyenes, i.e., those derived from copolymers of styrene and maleic anhydride, are outstanding when used in positive-working photoresist applications compared with previously used compositions. They exhibit a significantly improved combination of such properties as photospeed, semiaqueous processability and physical properties as well as excellent reimageability.

DETAILS OF THE INVENTION

Polyenes (i)

Examples of suitable N-alkenylmaleimide-containing polyenes include those derived from copolymers of maleic anhydride with such monomers as styrene, α-methylstyrene, p-chlorostyrene, p-methylstyrene, p-bromostyrene, and other substituted styrenes; acrylate esters such as methyl acrylate, ethyl acrylate, methyl methacrylate, allyl methacrylate, and butyl methacrylate; butadiene; ethylene; methyl vinyl ether, ethyl vinyl ether, isopropyl vinyl ether, 2-ethylhexyl vinyl ether, and butyl vinyl ether.

The polyenes of the invention can be prepared by reaction of a suitable maleic anhydride copolymer with an excess of N-alkenylamine by the general procedure described in U.S. Pat. Nos. 3,857,822 and 3,905,820.

Mercapto Acids (ii)

The contemplated mercapto acids are those that contain a single thiol, -SH, functional group. Suitable mercapto acids include mercaptocarboxylic acids, mercaptosulfonic acids, mercaptophosphonic acids, and mercaptophenols. Particularly preferred mercaptocarboxylic acids are those of the structure

wherein R is alkylene of 1 to 18 carbons, unsubstituted, or substituted with carboxyl or $C_1$ to $C_6$ alkoxycarbonyl groups.

Suitable mercapto acids are:
Mercaptoacetic acid
3-Mercaptopropionic acid
2-Mercaptopropionic acid
Mercaptosuccinic acid
6-Mercaptocaproic acid
Mercaptoitaconic acid
2-Mercaptocaproic acid
4-Mercaptomethylbenzoic acid
4-Mercaptomethylphenylpropionic acid
11-Mercaptoundecanoic acid
9-Mercaptostearic acid
Mercaptododecylsuccinic acid
2-Mercaptoethanesulfonic acid
3-Mercaptopropanesulfonic acid
4-Mercaptobutanesulfonic acid
Mercaptomethylphosphonic acid
2-(2-Mercaptoethyl)phenol
2-(3-Mercaptopropyl)phenol
Mercaptosuccinic acid, monomethyl ester
Mercaptosuccinic acid, mono-n-hexyl ester
Mercaptosuccinic acid, mono-2-ethoxyethyl ester
N-Acetylcysteine
12-Mercaptododecanoic acid.

Radical-Generating System (iii)

Practically any radiation-sensitive, radical-generating sysem which initiates addition of the mercapto acid to the reactive unsaturated carbon to carbon groups of the polyene is suitable for use in the photosensitive composition of this invention. Because process transparencies transmit heat originating from conventional sources of actinic radiation the preferred radical generating compounds are inactive thermally below about 85° C., and more preferably below about 185° C. They should be dispersible in the composition to the extent necessary for initiating the desired mercapto acid addition under the influence of the amount of radiation absorbed in relatively short term exposures.

The radical-generating system absorbs radiation of about 2000 to 5000 Å and has at least one component that has an active radiation absorption band with a molar extinction coefficient of at least about 50 within the range of about 2000 to 5000 Å. The term "active radiation absorption band" means a band of radiation which is active to produce the radicals necessary to initiate addition of the mercapto acid to the reactive unsaturated carbon to carbon groups of the polyene. The radical-generating system can be composed of one or more compounds which furnish radicals directly when subject to radiation. Alternatively, the system can contain sensitizers together with compounds which yield radicals after having been caused to do so by the radiation-activatable sensitizer(s).

A large number of radical-generating compounds can be utilized in the practice of the invention, including: aromatic ketones such as benzophenone, Michler's ketone [4,4'-bis(dimethylamino)benzophenone], 4,4'-bis(diethylamino)benzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, desoxybenzoin, and other aromatic ketones; benzoin, benzoin ethers such as benzoin methyl ether, methylbenzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl)-4,5-di-(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, and 2-(p-methylmercaptophenyl)-4,5-diphenylimidazolyl dimer.

Other useful 2,4,5-triarylimidazolyl dimer radical generating systems are disclosed in U.S. Pat. Nos. 3,479,185 and 3,784,557, and in British Pat. Nos. 997,396 and 1,047,569.

The imidazolyl dimers listed above can be used with a radical-producing sensitizer such as 2-mercaptobenzoxazole, Leuco Crystal Violet or tris(4-diethylamino-2-methylphenyl)methane. Such sensitizers as Michler's ketone can also be employed therewith as can energy transfer dyes such as Rose Bengal and Eosin Y.

Other useful radical-generating systems comprise cyclohexadienone compounds such as 4-methyl-4-trichloromethyl-2,5-cyclohexadienone, 3,4-dimethyl-4-trichloromethyl-2,5-cyclohexadienone, 4-dichloromethyl-4-methyl-2,5-cyclohexadienone, 2,6-di(tert-butyl)-4-methyl-4-trichloromethyl-2,5-cyclohexadienone, and other 2,5-cyclohexadienones which contain a trichloromethyl group and an alkyl or aryl group at the 4-position. Such cyclohexadienones can be used with a sensitizer such as Michler's ketone.

Additive Materials

Materials that can be included with the photosensitive composition in the element's photosensitive layer include polymeric binder(s) which serve to strengthen the composition or adhere it to a substrate. Radiation-transparent and film-forming polymers are preferred. Examples of suitable binders are thermoplastic macromolecular organic polymers which have number average molecular weights of at least about 1500, preferably at least 4000, including such polymer types as (a) copolyesters based on terephthalic, isophthalic, sebacic, adipic and hexahydroterephthalic acids; (b) nylons or polyamides; (c) vinylidene chloride copolymers; (d) ethylene/vinyl acetate copolymers; (e) cellulosic ethers; (f) synthetic rubbers; (g) cellulose esters; (h) polyvinyl esters including polyvinyl acetate/acrylate and polyvinyl acetate/methacrylate copolymers; (i) polyacrylate and α-alkylpolyacrylate esters, e.g., polymethyl methacrylate, polyethyl methacrylate, and methyl methacrylate/ethyl acrylate copolymers; (j) high molecular weight polyethylene oxides of polyglycols having average molecular weights of about 4000 to 1,000,000; (k) polyvinyl chloride and copolymers; (l) polyvinyl acetal; (m) polyurethanes; (n) polycarbonates; (o) polystyrenes; and the like.

If desired, the photosensitive composition can also contain immiscible polymeric or nonpolymeric organic fillers or reinforcing agents which are essentially transparent at the wavelengths used for the exposure, e.g., the organophilic silicas, bentonites, silica, powdered glass and colloidal carbon, as well as various types of pigments. Such materials are used in amounts varying with the desired properties of the photosensitive composition. The fillers are useful in improving the strength of the composition, reducing tack, and, in addition, as coloring agents. Additives which can be employed include dyes, colorants, pigments, dispersing agents, thermographic compounds, and the like.

With certain polyenes, it may be desirable to add a plasticizer to give flexibility to the resulting photosensitive layer and facilitate selective development. Suitable plasticizers include dialkyl phthalates, polyethylene glycols and related materials such as substituted phenol-/ethylene oxide adducts, e.g., the polyethers obtained from o-, m-, and p-cresol, o-, m-, and p-phenylphenol and p-nonylphenol, including commercially available materials such as the alkyl phenoxypolyoxethylene ethanols. Other plasticizers include the acetates, propionates, butyrates, caprylates and other carboxylate esters of ethylene glycol, diethylene glycol, glycerol, triethylene glycol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate.

In order to prevent premature radical reactions prior to use, there can be incorporated in the photosensitive composition a minor amount, for example, about 0.001 to 2 percent, based on the total photosensitive composition, of a stabilizer such as hydroquinone, tertiary-butyl catechol, 4-methyl-2,6-di-t-butylphenol, the nitroso dimer inhibitor systems of U.S. Pat. No. 4,168,982, the bis(substituted amino) sulfides of U.S. Pat. No. 4,168,981, the nitroaromatic photoinhibitors of U.S. Pat. No. 4,198,242, and the like. Such stabilizers improve the storage stability of the photosensitive elements by preventing thermal oxidation or reaction induced by exposure to adventitious radiation.

Photosensitive Element

Suitable substrates which, together with the photosensitive composition coated thereon, form the photosensitive elements of this invention include glass, a metal sheet or foil such as copper, aluminum, or stainless steel; a sheet or film of synthetic organic resin; cellulose paper; fiberboard; or a composite of two or more of these materials. Additional substrates include wood, cloth, silicon wafers, and cellulose esters such as cellulose acetate, cellulose propionate, cellulose butyrate, and the like. Also suitable are films or plates composed of various film-forming synthetic resins or high polymers, such as the addition polymers, in particular the vinylidene polymers such as vinyl chloride polymers, vinylidene chloride copolymers with vinyl chloride, vinyl acetate, styrene, isobutylene, and acrylonitrile; vinyl chloride copolymers with the latter polymerizable monomers; linear condensation polymers including polyesters such as polyethylene terephthalate; polyamides such as polyhexamethylene sebacamide; polyester amides such as polyhexamethylene adipamide/adipate, and the like.

Preferred substrates are thin and flexible grained aluminum sheets, steel sheets, copper sheets, silicon wafers, oriented polyethylene terephthalate film, polyvinylidene chloride copolymer-coated oriented polyester film, and gelatin-coated oriented polyester film. The particular substrate will generally be determined by the use application involved. For example, the photosensitive compositions of this invention are particularly useful for the preparation of photoresists when a copper substrate is used.

Fillers or reinforcing agents can be present in the synthetic resin or polymer bases, including synthetic, modified or natural fibers such as cellulosics like cotton, cellulose acetate, viscose rayon and paper. Also useful are glass wool, nylon, and the like. These reinforced bases can be used in laminated form.

The photosensitive element can have antihalation material beneath the photosensitive layer. For instance, the substrate can contain an antihalation material or have a layer or stratum of such material on its surface. The antihalation layer intermediate between the photosensitive layer and the substrate when used must have adequate adhesion to the substrate and the photosensitive layer and not react with the radiation-adsorptive material. Antihalation pigments include carbon black, manganese dioxide, Acid Blue Black and Acid Magenta O. Resin carriers for the antihalation materials can be polymers of vinyl compounds including copolymers of acrylic and methacrylic acid, polyvinyl chloride polymers and copolymers with vinyl acetate, diethyl fumarate, ethyl acrylate and the like.

The photosensitive compositions of this invention provide photosensitive elements which have a high resistance to oxygen inhibition of the photo reaction. As a result of this phenomenon in combination with the high photospeed, satisfactory images can often be obtained by exposure of the element to radiation in the presence of air. Nevertheless, it is sometimes desirable to carry out imaging in vacuum or to use a topcoat or protective stratum for the element. Such topcoats should be transparent to actinic radiation, substantially impermeable to oxygen and preferably permeable to water. Suitable coatings include, for instance, polyvinyl alcohol, polyvinyl acetate, gelatin, gum arabic, methyl vinyl ether/maleic anhydride copolymer, ethylene oxide polymer, and polyvinyl pyrrolidone, as more particularly described in one or more of: U.S. Pat. No. 3,458,311 and British Pat. Nos. 1,148,362 and 1,303,578.

The photosensitive composition is usually applied to the substrate as a solution or dispersion in a carrier solvent. The solution or dispersion can be sprayed, brushed, applied by a roller or an immersion coater, flowed over the surface, picked up by immersion or applied to the substrate by other suitable means. The solvent is then allowed to evaporate. In general, solvents are employed which are volatile at ordinary pressures. Suitable solvents include amides such as N,N-dimethylformamide and N,N-dimethylacetamide; alcohols and ether alcohols such as methanol, ethanol, 1-propanol, 2-propanol, butanol, ethylene glycol, 1,2-dimethoxyethane, 2-butoxyethanol, and 2-ethoxyethanol; esters such as methyl acetate and ethyl acetate; aromatic hydrocarbons and aromatic halocarbons such as benzene, o-dichlorobenzene and toluene; ketones such as acetone, 2-butanone, and 3-pentanone; aliphatic halocarbons such as 1,1,1-trichloroethane, methylene chloride, chloroform, 1,1,2-trichloroethane, 1,1,2,2-tetrachloroethane, 1,1,2-trichloroethylene; miscellaneous solvents such as dimethyl sulfoxide, pyridine, tetrahydrofuran, dioxane, dicyanocyclobutane, N-methylpyrrolidone; and mixtures of these solvents in various proportions as required to attain solutions.

Photoimaging Process

The photosensitive compositions and elements of this invention are exposed imagewise to actinic radiation. Exposure is preferably through an image-bearing transparency. Suitable sources of radiation include ordinary sunlight and artificial sources such as sunlamps, pulsed and continuous xenon flash lamps, tungsten-halogen lamps, germicidal lamps, ultraviolet lamps providing specifically radiation of short wavelength (2537 Å), and lamps providing radiation of longer wavelengths, narrow or broad band, centered near 3600 Å, 4200 Å, 4500 Å, or 5000 Å, such as fluorescent lamps, mercury, metal additive, and arc lamps. Argon glow lamps, photographic flood lamps, lasers and fluorescent radiation sources such as the tracings on the face of a cathode ray tube may also be used. Electron accelerators and electron beam sources through an appropriate mask are also suitable. Of these, the mercury-vapor lamps, particularly the sun lamp or "black light" type, the fluorescent sun lamps, the xenon flash lamps, and the tungsten-halogen lamps are the most preferred.

The radiation exposure times can vary from fractions of a second to minutes depending upon the intensity and spectral energy distribution of the radiation used, its distance from the photosensitive layer, and the nature and amounts of the photosensitive components in the layer. Customarily, a distance of about 1.5 to 60 inches (3.8 to 153 cm) from the photopolymerizable layer is used. Exposure temperatures are not particularly critical, but it is preferred to operate at about ambient temperatures or slightly higher, i.e., about 20° to 50° C.

Imagewise exposure is conveniently carried out by exposing the photopolymerizable element to actinic radiation through a process transparency, that is, an image-bearing transparency consisting of areas substantially opaque and substantially transparent to the radiation being used, where the opaque areas can be substantially of the same optical density; for example, a socalled line or halftone negative or positive. Suitable process transparencies also include those with a graded range of opaque areas; for example, a continuous tone negative. Process transparencies can be constructed of any suitable materials including cellulose acetate film and polyester film.

After exposure, the image is developed. Development can be by toning, i.e., dusting with a fine pigment which selectively adheres to the tacky areas, by dye imbibition or by modulation of diffusion. Generally, however, the portions of the layer corresponding to the exposed portions are removed, e.g., in photoresist applications. This latter method of development can be achieved by pressure transfer, differential adhesion of the exposed versus unexposed areas, use of peel apart transfer, and, preferably, by solvent washout. The solvent liquid used for development should have good solvent action in the exposed acidic portion of the composition, and little action in the unexposed areas in the time required to remove the exposed portion.

It is preferred to employ as development solvents an aqueous base or an aqueous base to which a water-soluble organic solvent is added. Suitable solvent mixtures include sodium hydroxide/isopropyl alcohol/water, sodium carbonate/water, sodium carbonate/2-butoxyethanol/water, sodium borate/2-butoxyethanol/water, sodium silicate/2-butoxyethanol/glycerol/water, and sodium carbonate/2-(2-butoxyethoxy)ethanol/water. The particular solvent combination chosen will depend upon the physical properties and carboxyl content of the exposed polyene.

Solvent development can be carried out at about 25° C., but best results are obtained when the solvent is at 30° to 60° C. Development time can be varied and usually is about 0.5 to 15 minutes. In the development step where the image is formed, the solvent can be applied in any convenient manner, as by pouring, immersion, spraying, or roller application. Spraying is preferred since it aids in the removal of the exposed portions of the composition.

Exposure of a photosensitive composition of the invention to actinic radiation causes addition of the mercapto group of the mercapto acid to reactive unsaturated carbon to carbon groups of the polyene in the exposed area to give a modified polymer which contains acid groups. Development, for example by solvent washout with aqueous alkali, provides for ready dissolution of the acid-containing polymer to give directly a positive image where the solubilized area corresponds to the exposed area. The photosensitive elements of the invention show good photochemical efficiency (good imaging speed).

There are a number of often interrelated factors which affect the performance of photosensitive compositions and elements of the invention. Among the more important of them are choice of polyene, mercapto acid and initiator, molecular weight of the polyene, relative concentrations of polyene/mercapto acid/initiator, development conditions, and choice of additives including plasticizers and the like. When the goal is to optimize performance, choice of a particular polyene may require care in selecting its molecular weight, and/or the mercapto acid to be employed. It was found, for instance, that polyenes based on copolymers of ethylene at certain molecular weights produced compositions which are not successfully developed. One way to overcome this deficiency is to employ such polyenes in the relatively low molecular weight range of about 1,000 to 5,000. In any event, one skilled in the art will encounter little difficulty in fabricating useful and efficient photosensitive compositions and elements of the invention based on the disclosure provided herein.

EXAMPLES

The following are illustrative of the invention in which all parts and percentages are by weight and all degrees are Celsius unless otherwise stated. Many of the unsaturated N-alkenylmaleimide polymers employed in the Examples were prepared by reaction of a designated alkenylamine with the appropriate polymer containing anhydride groups by Procedure A. Examples 7 and 8 represent preferred embodiments.

PROCEDURE A

Into a 100 mL 3-necked round bottom flask equipped with condenser and separating funnel was placed 10 g of anhydride copolymer and 50 mL of glacial acetic acid. The flask was purged with nitrogen, and 1.2 equivalents of amine based on anhydride groups present was added dropwise at room temperature. After the exothermic reaction had subsided, the reaction mixture was heated under reflux for 3 hr. The polymer dissolved during the heating period. The solution was cooled to room temperature, 5 mg of 2,6-di-tert-butyl-4-methylphenol was added, and the reaction mixture was poured slowly into 400 mL of water. The precipitated polymer was separated by filtration, washed with water, and air dried. The polymer was dissolved in about 200 to 300 mL of acetone and reprecipitated into water acidified by addition of 5 mL of hydrochloric acid per liter. The resultant polymer was dried overnight on filter paper and finally dried under vacuum at room temperature. The polymers were characterized by IR, NMR and elemental analysis.

Polymers prepared by Procedure A are listed in Table 1.

TABLE 1

N—ALKENYLMALEIMIDE COPOLYMERS

| | | | Polymer Properties | |
|---|---|---|---|---|
| Copolymer Designation | Anhydride Copolymer | Amine Reactants Molar Ratio | N Anal. % | Anhydride Group Conversion % |
| A | (1) | 1/9 allyl/propyl | 4.0 (2) | 95 |
| B | (1) | 9/1 allyl/dodecyl | 3.7 | 96 |
| C | (3) | allyl | 3.1 | 99 |
| D | (1) | 9/1 allyl/δ-aminobutyric acid | 3.9 | 101 |
| E | (1) | 9/1 allyl/p-aminobenzoic acid | 3.66 | |
| F | (1) | 2-methylallylamine | 4.6 | 94 |
| G | (5) | 1/4 allyl/propyl | 6.00 | 83 |
| H | (1) | allyl | (4) | |
| I | (6) | allyl | 3.3 | 71 |

(1) Commercial styrene/maleic anhydride copolymer, 2/1 molar ratio, $\overline{M}_n$ 1700
(2) Infrared analysis showed imide group absorption at 5.6, 5.8 μm
(3) Commercial styrene/maleic anhydride copolymer, 3/1 molar ratio, $\overline{M}_n$ 1900
(4) NMR is consistent with the structure
(5) Commercial methyl vinyl ether/maleic anhydride copolymer; low molecular weight, specific viscosity 0.1 to 0.5.
(6) Commercial octadecene/maleic anhydride copolymer, 1/1 molar ratio.

EXAMPLE 1

Preparation of N-allylmaleimide Copolymer

A mixture of 25 g of a commercial styrene/maleic anhydride copolymer (1/1 molar ratio, $\overline{M}_n$ 1600) and 250 mL of glacial acetic acid was stirred under nitrogen while 7.1 g of allylamine was added dropwise over a period of 10 min. The mixture was then heated at 114° for 2 hours. The clear solution was cooled, treated with 0.125 g of 2,6-di-tert-butyl-4-methylphenol, and added with stirring to about 2500 mL of water. The precipitated polymer was filtered, washed, re-dissolved in about 700 mL of acetone and again precipitated in excess water acidified with 10 mL of concentrated hydrochloric acid/liter. The resultant polymer was dried to constant weight under vacuum. The N-allylmaleimide copolymer was obtained as a white powder; weight 25.4 g. The infrared spectrum showed imide absorption at 1705 cm$^{-1}$ and 1775 cm$^{-1}$, and essentially no anhydride or amide absorption was seen. The nmr spectrum was also consistent with the styrene/N-allylmaleimide structure. The nitrogen analysis and nmr spectrum indicated about 75% conversion of anhydride groups to N-allylmaleimide groups, and complete hydrolysis was indicated for the remainder of the anhydride units. Found, N 4.38%.

Preparation and Use of Photosensitive Composition

A coating solution of the photosensitive composition was prepared as follows:
1.00 g of N-allylmaleimide copolymer,
0.19 g of 11-mercaptoundecanoic acid,
0.15 g of benzil dimethyl ketal,
0.04 g of ethylene glycol dicaprylate plasticizer,
0.004 g of 2,6-di-tert-butyl-4-methylphenol inhibitor,
0.004 g of benzotriazole,
0.004 g of C. I. Solvent Red Dye #109,
4.18 g of 90/10 methylene chloride/methanol solvent.

The resulting clear solution was coated onto a 25 μm oriented polyester film substrate with an 8-mil (200-μm) doctor knife. The coated film was dried in an air oven at 55° for 30 min to give a coating of approximately 38 μm in thickness. The coated film was then laminated to a freshly pumiced, blank copper laminate board by passing the film and board through a mechanically driven roll-laminator at 120°/2.5 f.p.m.

A sample of the coated board was exposed through a $\sqrt{2}$ step wedge process transparency in a vacuum printing frame to radiation from a metal halide lamp covering the 3600 Å to 4500 Å spectral range at a distance of 38 cm for a time which corresponds to a radiation dosage of 22 units and an integrated light intensity of 190 mj/cm$^2$ incident on the exposed surface of the transparency. The polyester coversheet was removed, and the exposed panel was spray-developed at 35°/45 psi (310 kPa) with a solution prepared from 2700 mL of water, 300 g of 2-(2-butoxyethoxy)ethanol and 24 g of sodium carbonate. The board was located at a distance of 27 cm from the spray nozzle during development. After 1 minute, development of the exposed portion of the panel to step 7 (30 mj/cm$^2$) was complete down to the copper surface.

A second sample of the coated board was exposed as described and developed for 2 minutes by the same procedure. The panel was dried for 5 min at 55°, and the exposed copper was etched from the fiber-glass backing in a cupric chloride bath at 60° for 5 min. The etched plate was then reexposed through a process transparency to an additional 22 units of radiation and the exposed plate was again developed for 2 min. Development of the second exposed area was complete down to the surface. This experiment demonstrates that the photosensitive coating has add-on capability since the unexposed composition is still functional after development and etching steps. The exposed image exhibited excellent adhesion and etch resistance.

EXAMPLE 2

This Example illustrates development with an all-aqueous developer solution.

A 25 percent solids coating solution of the photosensitive composition was prepared as follows:
1.00 g of the N-allylmaleimide copolymer of Example 1,
0.30 g of 11-mercaptoundecanoic acid,
0.10 g of benzil dimethyl ketal,
0.12 g of ethylene glycol dicaprylate,
0.004 g of 2,6-di-tert-butyl-4-methylphenol,
0.004 g of benzotriazole,
0.004 g of C.I. Solvent Red Dye #190,
4.60 g of 90/10 methylene chloride/methanol solvent.

The composition was coated, dried, laminated onto a copper board, and exposed as described in Example 1. The board was spray-developed at 50°/310 kPa with a solution prepared from 3000 mL of water and 30 g of sodium carbonate. After 3 min, development of the exposed portion of the panel to step 4 (87 mj/cm$^2$) was complete down to the copper surface. Development at 35°/310 kPa with the solution employed in Example 1 gave development to step 13 (11 mj/cm$^2$) after 1 min, but some attack of the unexposed areas by the solvent was noted.

EXAMPLE 3

A coating solution of the photosensitive composition was prepared as follows:
1.00 g of the N-allylmaleimide copolymer of Example 1,
0.30 g of mercaptosuccinic acid,
0.10 g of benzil dimethyl ketal,
0.08 g of Paraplex ® G-30 plasticizer,
0.004 g of 2,6-di-tert-butyl-4-methylphenol,
0.004 g of benzotriazole,
0.004 g of C. I. Solvent Red Dye #109,
4.48 g of 90/10 methylene chloride/methanol solvent.

The composition was coated, dried, laminated, exposed and developed as described in Example 1. After 4 min, development of the exposed portion of the panel to step 3 (120 mj/cm$^2$) was complete down to the copper surface.

A second sample of the coated board was exposed, developed, etched, and reexposed through a process transparency to an additional 22 units of radiation. The exposed board was developed for 2 min as described in Example 1, and development of the second exposed area was complete down to the surface. The coating exhibited ragged edges after etching and was thus less resistant to the etchant than the coating of Example 1.

EXAMPLE 4

A 25 percent solids coating solution of the photosensitive composition was prepared as described in Example 2 except that 0.10 g of the ethylene glycol dicaprylate, 0.12 g of benzotriazole and 0.012 g of 2,6-di-tert-butyl-4-methylphenol were used in the formulation. The composition was coated, dried, laminated, and exposed as described in Example 1. The board was spray-developed at 40°/310 kPa with a solution prepared by mixing 120 mL of 2-(2-butoxyethoxy)ethanol and 2880 mL of a solution prepared from 30 g of sodium carbonate and 2970 mL of water. After 1 min, development of the exposed portion of the panel to step 4 (87 mj/cm$^2$) was complete down to the copper surface. The coating showed good add-on capability when tested for second imaging as described in Example 1.

EXAMPLE 5

An aluminum substrate was employed as follows. A 25 percent solids coating solution of the photosensitive composition was prepared as described in Example 2 except that 0.10 g of ethylene glycol dicaprylate was used in the formulation. The composition was coated, dried, and laminated onto a pumiced aluminum sheet. Exposure and spray development at 40°/310 kPa was carried out as described in Example 4. After 1 min, development of the exposed portion of the panel to step 6 (42 mj/cm$^2$) was complete down to the aluminum surface.

EXAMPLE 6

A coating solution of the photosensitive composition was prepared as follows:
1.00 g of the N-allylmaleimide copolymer of Example 1,
0.20 g of 11-mercaptoundecanoic acid,
0.10 g of mercaptosuccinic acid,
0.10 g of ethylene glycol dicaprylate,
0.004 g of 2,6-di-tert-butyl-4-methylphenol,
0.004 g of benzotriazole,
0.004 g of C. I. Solvent Red Dye #109,
4.54 g of 90/10 methylene chloride/methanol solvent.

The composition was coated, dried, laminated, exposed and developed as described in Example 4. After 2 min, development of the exposed portion of the panel to step 5 (57 mj/cm$^2$) was complete down to the copper surface. The coating showed fair add-on capability when tested for second imaging as described in Example 1.

EXAMPLE 7

A 25 percent solids coating solution of the photosensitive composition was prepared as described in Example 2 except that 0.15 g of benzil dimethyl ketal and 0.10 g of ethylene glycol dicaprylate were used in the formulation. The composition was coated, dried, laminated, exposed and developed as described in Example 4. After 1 min, development of the exposed portion of the panel to step 4 (87 mj/cm$^2$) was complete down to the copper surface.

A second, unexposed panel was spray-developed at 40°/310 kPa for 2 min with the developer solution, dipped into a cupric chloride etching bath at 60° for 3 min, and then exposed through a √2 step wedge as described in Example 4. An oriented polyester film coversheet was inserted between the coating and the step wedge during exposure. The panel was then spray-developed to determine the photospeed of the composition. After 1 min, development of the exposed portion of the panel to step 5 (57 mj/cm$^2$) was complete down to the copper surface. This demonstrates that the add-on photospeed of the composition is substantially unchanged by the processing steps employed to make the first print-and-etch image.

A third panel was exposed to 10 units (87 mj/cm$^2$) of radiation through a resolution target and developed as described. Resolution of 2-mil (51-μm) lines and spaces was achieved. The exposed copper was subsequently etched from the panel in a cupric chloride bath at 60° without undercutting or loss of adhesion of the coating.

EXAMPLE 8

Preparation of N-Allylmaleimide Copolymer

A mixture of 25 g of a commercial styrene/maleic anhydride copolymer (2/1 molar ratio, $\overline{M}_n$ 1700), 250 mL of glacial acetic acid, and 4.65 g of allylamine was prepared and treated by the procedure described for the copolymer in Example 1. A total of 23.4 g of dried N-allylmaleimide copolymer was obtained. The infrared spectrum showed only traces of anhydride or amide absorption. The nitrogen analysis and nmr spectrum indicated about 85% conversion of anhydride groups to imide groups, and complete hydrolysis was indicated for the remainder of the anhydride units. Found, N, 3.34%.

Preparation and Use of Photosensitive Composition

A 25 percent solids coating solution of the photosensitive composition was prepared as follows:
1.00 g of the N-allylmaleimide copolymer,
0.30 g of 11-mercaptoundecanoic acid,
0.15 g of benzil dimethyl ketal,
0.10 g of ethylene glycol dicaprylate,
0.004 g of 2,6-di-tert-butyl-4-methylphenol,
0.004 g of benzotriazole,
0.004 g of C. I. Solvent Red Dye #109,
4.60 g of 90/10 methylene chloride/methanol solvent.

The composition was coated, dried, laminated, exposed, and developed as described in Example 4. After 1 min, development of the exposed portion of the panel to step 5 (57 mj/cm$^2$) was complete down to the copper surface.

A second, unexposed panel was pre-developed, etched, exposed and developed as described in Example 7. After 2 min, development of the exposed portion of the panel to step 6 (42 mj/cm$^2$) was complete to the copper surface. Only partial development with no loss of steps was observed after 1 min of development time.

A third panel was exposed to 10 units (187 mj/cm$^2$) of radiation through a resolution target and developed as described. Resolution of 2-mil (51-μm) lines and spaces was observed after 1 min development. The etch resistance and adhesion of the coating was similar to the coating described in Example 7.

EXAMPLES 9 TO 14

A coating solution of the photosensitive composition was prepared as follows:
1.00 g of a designated copolymer listed in Table 1,
0.30 g of 11-mercaptoundecanoic acid,
0.15 g of benzil dimethyl ketal,
0.10 g of ethylene glycol dicaprylate,
0.004 g of 2,6-di-tert-butyl-4-methylphenol,
0.004 g of benzotriazole,
0.004 g of C. I. Solvent Red Dye #109,
4.60 g of 90/10 methylene chloride/methanol solvent.

The composition was coated, dried, laminated onto a copper board, and exposed as described in Example 1. After development, resolution, etch resistance, and photospeed of the add-on images were determined as described in Example 7. The coated panels (third panels) exposed for measurement of resolution and etch resistance were exposed for a time which corresponded to a light intensity of 130 mj/cm³ in Examples 9, 10, 11 and 14, and an intensity of 87 mj/cm² for Example 12 and 13. Results are summarized in Tables 2 and 3.

TABLE 2

| | | | Primary Image | |
|---|---|---|---|---|
| Example | Copolymer | Developer Solution | Development Time minutes | Step No. (mj/cm²) |
| 9 | A | (1) | 5 | 4 (87) |
| 10 | B | (1) | 1 | 6 (42) |
| 11 | C | (1) | 3 | 3 (120) |
| 12 | D | (2) | 1 | 7 (30) |
| 13 | E | (2) | 1 | 6 (42) |
| 14 | F | (1) | 1 | 4 (87) |

(1) Spray-development with the solution, and under the conditions, described for the exposed panel of Example 1.
(2) Spray-development with the solution, and under the conditions, described for the exposed panel of Example 4.

TABLE 3

| | Add-On Image | | | |
|---|---|---|---|---|
| Example | Development Time, min | Step No. (mj/cm²) | Resolution μm | Etch Resistance |
| 9 | 4 | 6 (42) | 130 (1) | Good |
| 10 | 1 (2) | 5 (57) | 50 | Good |
| 11 | 5 | 5 (57) | 130 (1) | — |
| 12 | 0.5 | (3) | 75 | — |
| 13 | 1 | (3) | 50 | Good |
| 14 | 1.5 | 6 (42) | 50 | Good |

(1) Finer lines were washed off during rinsing.
(2) The unexposed panel was predeveloped for 1 min instead of 2 min.
(3) The coating washed off during development.

EXAMPLE 15

A coating of the photosensitive composition was prepared as follows:
1.00 g of copolymer G,
0.30 g of 11-mercaptoundecanoic acid,
0.15 g of benzil dimethyl ketal,
0.12 g of ethylene glycol dicaprylate,
0.004 g of 2,6-di-tert-butyl-4-methylphenol,
0.004 g of benzotriazole,
0.004 g of C. I. Solvent Red Dye #109,
3.7 mL of 90/10 methylene chloride/methanol solvent.

The composition was coated, dried, laminated onto a copper board, and exposed to a radiation dosage which corresponds to an integrated light intensity of 200 mj/cm² as described in Example 1. The board was spray-developed at room temperature/310 kPa with a solution prepared by mixing 120 mL of 2-(2-butoxyethoxy)ethanol and 2880 mL of a solution prepared from 30 g of sodium carbonate and 2970 mL of water. After 50 sec, development of the exposed portion of the panel to step 2 was observed.

EXAMPLE 16

A coating of the photosensitive composition was prepared as follows:
1.00 g of copolymer H,
0.22 g of 11-mercaptoundecanoic acid,
0.18 g of benzophenone,
0.02 g of Michler's ketone,
0.02 g of 4-methyl-4-trichloromethyl-2,5-cyclohexadienone,
0.12 g of ethylene glycol dicaprylate,
0.004 g of 2,6-di-tert-butyl-4-methylphenol,
0.004 g of benzotriazole,
0.004 g of C. I. Solvent Red Dye #109,
3.6 mL of 90/10 methylene chloride/methanol solvent.

The composition was coated, dried, laminated onto a copper board, and exposed to a radiation dosage which corresponds to an integrated light intensity of 200 mj/cm² as described in Example 1. The board was spray-developed at 35°/310 kPa with a solution prepared by mixing 120 mL of 2-(2-butoxyethoxy)ethanol and 2880 mL of a solution prepared from 30 g of sodium carbonate and 2970 mL of water. After 2 min, development gave a relief image that was not washed off completely to the base.

EXAMPLE 17

A coating of the photosensitive composition was prepared as follows:
1.00 g of copolymer I,
0.20 g of 11-mercaptoundecanoic acid,
0.15 g of benzil dimethyl ketal,
0.004 g of 2,6-di-tert-butyl-4-methylphenol,
0.004 g of benzotriazole,
0.004 g of C. I. Solvent Red Dye #109,
2.77 g of acetone solvent.

The composition was coated, dried, laminated onto a copper board, exposed, and developed as described in Example 1. After development at 35° for 30 seconds, a visible image was observed, but most of the steps had washed off.

The embodiments of the invention in which an exclusive property or privilege is claimed are defined as follows:

1. A photosensitive composition comprising the following components:
  (i) about 10 to 90 percent by total weight of components (i), (ii), and (iii), of a polyene having a number average molecular weight of about 1,000 to 25,000, said polyene containing (a) about 20 to 1000 milliequivalents of reactive unsaturated carbon to carbon groups per 100 g of polyene, and (b) about 10 to 50 mole percent of N-alkenylmaleimide units in which the alkenyl group contains about 3 to 18 carbon atoms;
  (ii) about 5 to 50 percent by total weight of components (i), (ii), and (iii), of a reactive mercapto acid; and
  (iii) about 0.1 to 50 percent by total weight of components (i), (ii), and (iii) of a radiation-sensitive, radical-generating system, activatable by actinic radiation to initiate addition of the mercapto acid to the polyene.

2. A composition according to claim 1 wherein the polyene is present at about 40 to 80 percent by total weight of components (i), (ii) and (iii).

3. A composition according to claim 2 wherein the polyene contains at least one group selected from

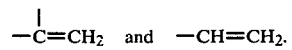

4. A composition according to claim 3 wherein the polyene is derived from copolymers of maleic anhydride with at least one member of the group consisting essentially of styrene, α-methylstyrene, p-chlorostyrene, p-methylstyrene, p-bromostyrene, methyl acrylate, ethyl acrylate, methyl methacrylate, allyl methacrylate and butyl methacrylate; butadiene; ethylene; methyl vinyl ether, ethyl vinyl ether, isopropyl vinyl ether, 2-ethylhexyl vinyl ether, and butyl vinyl ether.

5. A composition according to claim 4 wherein the polyene consists essentially of an N-alkenylmaleimide derivative of a copolymer of styrene and maleic anhydride.

6. A composition according to any one of claims 1, 2, 3, 4 or 5 wherein the molecular weight of the polyene is about 1,000 to 10,000 and there are about 50 to 500 milliequivalents of reactive unsaturated carbon to carbon groups per 100 grams of polyene.

7. A composition according to claim 1 wherein the mercapto acid is present in an amount of about 10 to 40 percent by total weight of components (i), (ii) and (iii).

8. A composition according to claim 7 wherein the mercapto acid is a mercaptocarboxylic acid.

9. A composition according to any one of claims 1, 7 or 8 wherein the mercapto acid has the structure

HS-R-CO₂H wherein R is alkylene of 1 to 18 carbons, unsubstituted or substituted with carboxyl or alkoxycarbonyl groups.

10. A composition according to claim 1 wherein the radical-generating system is present in an amount of about 1 to 20 percent by total weight of components (i), (ii) and (iii).

11. A composition according to claim 1 or 10 wherein the radical-generating system comprises a benzoin ether.

12. A composition according to claim 6 wherein the mercapto acid has the structure

HS-R-CO₂H wherein R is alkylene of 1 to 18 carbons, unsubstituted or substituted with carboxyl or alkoxycarbonyl groups, and the radical-generating system comprises a benzoin ether.

13. A composition according to claim 5 wherein the mercapto acid is 11-mercaptoundecanoic acid and the radical-generating system is the compound, benzil dimethyl ketal.

14. A composition according to claim 5 wherein the radical-generating system comprises 4-methyl-4-trichloromethyl-2,5-cyclohexadienone, benzophenone, amd Michler's ketone.

15. A composition according to claim 14 wherein the mercapto acid is 11-mercaptoundecanoic acid.

16. A composition according to one of claims 13, 14 or 15 wherein the polyene is an N-alkenylmaleimide derivative of a copolymer of styrene and maleic anhydride.

17. A photosensitive element comprising a substrate coated with the photosensitive composition of claim 1.

18. A photosensitive element comprising a substrate coated with the photosensitive composition of claim 13.

19. A photosensitive element comprising a substrate coated with the photosensitive composition of claim 14.

20. A photosensitive element according to claim 17 wherein the substrate is copper.

21. A photosensitive element according to claim 18 wherein the substrate is copper.

22. A photosensitive element according to claim 19 wherein the substrate is copper.

23. A method of photoimaging comprising imagewise exposing the photosensitive element of claim 17 to actinic radiation, and developing the image.

24. A method of photoimaging comprising imagewise exposing the photosensitive element of claim 18 to actinic radiation, and developing the image.

25. A method of photoimaging comprising imagewise exposing the photosensitive element of claim 19 to actinic radiation, and developing the image.

26. A method according to any one of claims 23, 24 or 25 wherein the substrate is copper.

* * * * *